US009961142B2

(12) United States Patent
Li et al.

(10) Patent No.: US 9,961,142 B2
(45) Date of Patent: May 1, 2018

(54) DATA STORAGE METHOD, DEVICE AND DISTRIBUTED NETWORK STORAGE SYSTEM

(75) Inventors: Hui Li, Guangdong (CN); Xianxia Huang, Guangdong (CN); Hanxu Hou, Guangdong (CN); Tai Zhou, Guangdong (CN); Bing Zhu, Guangdong (CN); Changmin Chen, Guangdong (CN); Jingbang Zhou, Guangdong (CN)

(73) Assignees: PEKING UNIVERSITY SHENZHEN GRADUATE SCHOOL, Shenzhen, Guangdong (CN); SHENZHEN IPTV CO., LTD., Shenzhen, Guangdong (CN)

( * ) Notice: Subject to any disclaimer, the term of this patent is extended or adjusted under 35 U.S.C. 154(b) by 0 days. days.

(21) Appl. No.: 13/818,360

(22) PCT Filed: Feb. 15, 2012

(86) PCT No.: PCT/CN2012/071177

§ 371 (c)(1), (2), (4) Date: Feb. 22, 2013

(87) PCT Pub. No.: WO2013/104135

PCT Pub. Date: Jul. 18, 2013

(65) Prior Publication Data

US 2014/0317222 A1 Oct. 23, 2014

(30) Foreign Application Priority Data

Jan. 13, 2012 (CN) .......................... 2012 1 0011386

(51) Int. Cl.

*H04L 29/08* (2006.01)
*H03M 13/15* (2006.01)

(Continued)

(52) U.S. Cl.

CPC ...... *H04L 67/1097* (2013.01); *G06F 11/1092* (2013.01); *H03M 13/033* (2013.01); *H03M 13/1515* (2013.01); *H04L 67/1095* (2013.01)

(58) Field of Classification Search

CPC ............. H04L 67/1097; G06F 11/1662; G06F 11/2094; G06F 11/1092; H03M 13/15;

(Continued)

(56) References Cited

U.S. PATENT DOCUMENTS 8,631,269 B2 * 1/2014 Vinayak et al. ............. 714/4.11
9,104,603 B2 * 8/2015 Le Scouarnec ..... G06F 11/1092

(Continued)

OTHER PUBLICATIONS

Rashmi, KV, "Explicit Code Constructions for Distributed Storage", Indian Institute of Science, Jun. 2010.*

(Continued)

*Primary Examiner* — Ramy M Osman

(74) *Attorney, Agent, or Firm* — Jackson IPG PLLC; Demian K. Jackson

(57) ABSTRACT

A method, device and system disclosed used in storage technique, comprising: splitting a file of size M into k blocks, that is to say, each block is of size M/k; issuing the above k blocks across k different storage nodes in the distributed network storage system in a distributed manner; using the k blocks, constructing n−k independent blocks via linear coding method, and satisfying the property that any k of the n encoded blocks can be used to reconstruct the original data in the file, which means the linear coding method is a kind of Maximum-Distance Separable (MDS) code; distribute the n−k encoded blocks to the rest n−k different storage codes in the distributed network storage systems.

2 Claims, 8 Drawing Sheets

(51) Int. Cl.
*H03M 13/03* (2006.01)
*G06F 11/10* (2006.01)

(58) Field of Classification Search
CPC ........... H03M 13/151; H03M 13/1515; H03M 13/033
See application file for complete search history.

(56) References Cited

U.S. PATENT DOCUMENTS

| | | | | |
|---|---|---|---|---|
| 9,430,443 | B1 * | 8/2016 | Jensen | H03M 13/033 |
| 9,722,637 | B2 * | 8/2017 | Li | H03M 13/1515 |
| 2011/0289351 | A1 * | 11/2011 | Rashmi et al. | 714/6.32 |
| 2013/0073896 | A1 * | 3/2013 | Le Scouarnec | G06F 11/1092 714/6.3 |
| 2014/0317222 | A1 * | 10/2014 | Li et al. | 709/213 |
| 2015/0095747 | A1 * | 4/2015 | Tamo | H03M 13/151 714/781 |
| 2015/0127974 | A1 * | 5/2015 | Jiekak | G06F 11/1092 714/6.24 |
| 2015/0142863 | A1 * | 5/2015 | Yuen | H04L 67/1097 707/827 |
| 2017/0179979 | A1 * | 6/2017 | Hussain | H03M 13/154 |

OTHER PUBLICATIONS

Rashmi, et al, “Optimal Exact-Regenerating Codes for Distributed Storage at the MSR and MBR Points”, IEEE, Jan. 20, 2011.*

Cadambe et al, “Distributed Data Storage with Minimum Storage Regenerating Codes”, University of California, Apr. 24, 2010.*

Administrator , “Erasure Coding for Distributed Storage Wiki, MSR Codes”, storagewiki.ece.utexas.edu, Jul. 16, 2013.*

Suh et al., “Exact Regeneration Codes for Distributed Storage Repair Using Interface Alignment”, Apr. 15, 2010, IEEE Transactions on Information Theory, version 2.*

* cited by examiner

DATA STORAGE METHOD, DEVICE AND DISTRIBUTED NETWORK STORAGE SYSTEM

FIELD OF THE INVENTION

This invention relates to the field of storage technique, and more particularly, relates to a data storage method, device and distributed network storage system.

BACKGROUND OF THE INVENTION

Network coding (NC), born in 2000, is a new breakthrough in solving the channel capacity limit problem, followed by C. E. Shannon published paper "A Mathematical Theory of Communication". It solves the problem in network communication that how the single/multi-source to multi-receiver points multicast/broadcast reached the limit of network capacity.

In traditional, the routing switches of the network communication nodes only complete store-and-forward function. NC points out that if we allow the routing switches to send information after encoding input information flow, then the network nodes will complete both routing functions and encoding functions. In this new architecture, network performance can reach the theoretical limit of the max-flow problem.

With the development of the scale of storage system, failure rate also increases significantly, more and more people propose for higher fault tolerance of storage system. The prior technique achieves the reliability of distributed storage system by erasure coding primarily. Compared to RAID systems, the commonly used RAID-5 products can provide recovery of one single disk failure, and RAID-6, which can repair double disk failure, gradually comes into practice. The principle of RAID-5 system, that tolerate one single disk failure, lies in parity check. In order to reach all aspects of performance optimization, RAID-6 system that can tolerate double disk failure, needs a "special" erasure code.

The limited factor of erasure code in distributed systems decreases to some extent, such as using the Galois field operations instead of XOR operation. In general, the status of each distributed node is the same, which means that it does not necessarily require a systematic coding. In addition, the scale of distributed system is usually very large, which also requires that the coding rate can't excessively decrease as the scale increases. It's quite popular to use Reed Solomon coding (MacWilliams, and Sloane, 1977) in distributed systems, and the degree of redundancy can be achieved as practical needs. Encoding and decoding processes are operated in relatively large Galois field. Obviously, the whole operation cost is significantly larger than XOR operation. Reed Solomon coding principle is established on the polynomial theory, there are many forms of generator matrix. A widely used coding technique is to use Vandermonde matrix as generator matrix:

$$G = \left( I_n \left| \begin{matrix} 1 & 1 & 1 & \ldots & 1 \\ 1 & 2 & 2^2 & \ldots & 2^{n-1} \\ 1 & 3 & 3^2 & \ldots & 3^{n-1} \\ \vdots & \vdots & \vdots & \vdots & \vdots \\ 1 & n & n^2 & \ldots & n^{n-1} \end{matrix} \right. \right)$$

Here, both m and n can be flexibly chose as needed, in order to achieve the arbitrary coding rate. Erasure codes use the mature coding theory to chunk the original data and encode the data chunks. That is, the original data is divided into n parts, and meanwhile, generates m redundant blocks. Arbitrary n of the total n+m blocks are able to recover original data. Wherein, some nodes store the original data blocks, while others store the encoded redundant blocks. It's obvious that their statuses and functions are different, and sometimes central node is needed in the encoding process in the distributed environment.

Subsequently, random linear coding scheme is proposed for the distributed storage. Even though it also achieves distributed data storage, and the entire file is divided into several blocks, encoded blocks joint together by random linear combination of all blocks. However, it is required to store each encoded block's coding vector, and the missed file is recovered by collecting encoded vectors and encoded blocks obtained from other nodes. This increases the amount of storage and data processing load of the node, and also the communication bandwidth during the repair process of the node.

In summary, the existing data storage methods can not guarantee the reliability of the distributed network storage system.

SUMMARY OF THE INVENTION

A method, device and system disclosed used in storage technique, includes: splitting a file of size M into k blocks, that is to say, each block is of size M/k; issuing the above k blocks across k different storage nodes in the distributed network storage system in a distributed manner; using the k blocks, constructing n−k independent blocks via linear coding method, and satisfying the property that any k of the n encoded blocks can be used to reconstruct the original data in the file, which means the linear coding method is a kind of Maximum-Distance Separable (MDS) code; distributing the n−k encoded blocks to the rest n−k different storage codes in the distributed network storage systems. This invention, enables the distributed network storage system tolerates at most n−k simultaneous failures of nodes without losing data, and keeps the redundancy of system in an invariant level, while at the same time, ensures the reliability of the distributed network storage system.

DETAILED DESCRIPTION OF THE PREFERRED EMBODIMENTS

Figure 1:
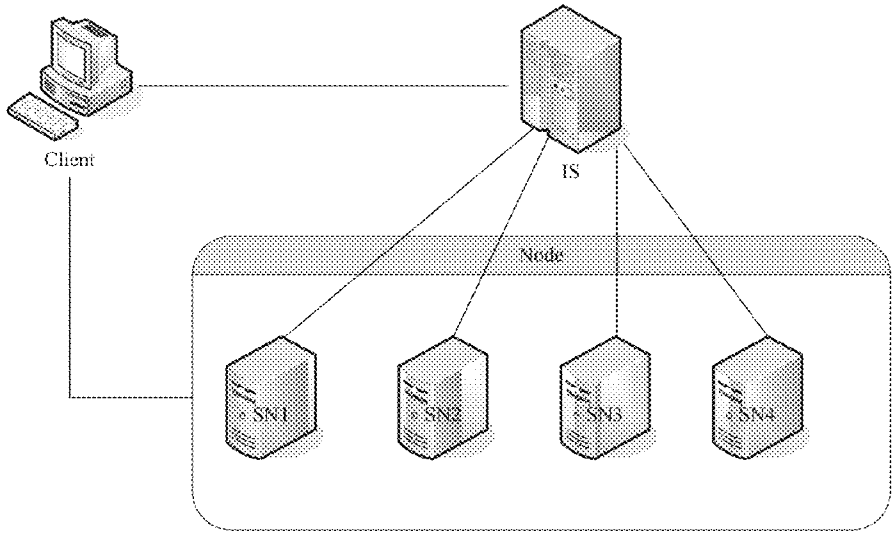
FIG. 1 illustrates the overall framework of the schematic diagram of a distributed network storage system that this invention case provides.

The embodiment of the invention provides a method of storing data, device and distributed network storage system, aims at solving the problem that the reliability of distributed network storage system cannot be guaranteed, which is provided by the methods of the prior technique of storing data.

This invention provides a method of storing data, the method comprising:

Splitting a file of size M into k blocks, each block is of size M/k;

Issuing the above k blocks across k different storage nodes in the distributed network storage systems in a distributed manner;

Constructing n−k independent blocks via linear coding method, and satisfy the property that any k of the n encoded blocks can be used to reconstruct the original data in the file, which means the linear coding method is a kind of Maximum-Distance Separable (MDS) code;

Distributing the n−k encoding blocks to the rest n−k different storage codes in the distributed network storage systems.

Wherein, n, k are both positive integers, and satisfy the property that n>k. And n is the number of total nodes in distributed network storage system, while k is the least number of nodes that needed to reconstruct the original file.

For another, this invention provides a device of storing data, the device comprising:

The data block unit, is used to split a file of size M into k blocks, each block is of size M/k;

The first block allocation unit, is used to issue the k blocks into k different nodes in the distributed network storage system;

The encoding unit, is used to construct n−k independent blocks via linear coding from the k blocks, and satisfies the property that arbitrary k of the n encoded blocks can be used to reconstruct the original data, which means the linear coding method is a kind of Maximum-Distance Separable (MDS) code;

The second block allocation unit, is used to issue the n−k encoding blocks into the rest n−k different storage codes in the distributed network storage systems.

Wherein, n, k are both positive integers, and satisfy n>k. And n is the number of total nodes in distributed network storage system, while k is the least number of nodes that needed to reconstruct the original file.

What's more, this invention also provides a distributed network storage system (including client), the system further comprises data storage apparatus that connects to the client. The data storage apparatus is data node and index server in the distributed network storage system.

In the embodiment of this invention, the data is divided into k blocks, and stored in k different nodes. Then use the above k blocks, and construct n−k independent blocks via linear coding method (Maximum-Distance Separable (MDS) code), satisfying the property that any k of the n encoded blocks can be used to reconstruct the original data in the file. After that, distribute the n−k encoded blocks to the rest n−k different storage codes. This invention enables the system to tolerate at most n−k nodes' simultaneous failure without losing data, keep the redundancy of system in an invariant level, and ensure the reliability of the distributed network storage system at the same time.

In order to make the intentions, technical scheme and advantages of the present invention more apparent, the present invention will be described in further detail below in conjunction with the accompanying diagrams and embodiments. It should be understood that the specific embodiments described herein are only used to explain the present invention and are not limited to the present invention.

Data is scattered and stored in multiple independent devices in the distributed storage systems. Traditional network storage system uses a centralized storage server to store all data, storage servers become the bottleneck of the system performance, and the focus of system reliability as well as system security. Obviously, traditional network storage system cannot meet the needs of large-scale storage applications.

Distributed network storage system uses a scalable system architecture, sharing the storage load by using multiple storage servers, storing location information by using the location server, it will not only improve system reliability, availability and access efficiency, but also easy to extend.

FIG. 1 is an overall framework for the schematic diagram of the distributed network storage system. There are four nodes (SN1-SN4) in the system, also an index server IS and a client represented by the PC, IS and SN constitute the server side. IS stores the naming and routing information of each node, the entire system's directory structure, the mapping between file names and blocks as well as the storage location of each file block etc. The role of IS is similar to the file partition table of traditional file system. When users want to upload or download files, find the specified SN by IS, then interact with SN.

Embodiment of the invention, introduces redundancy through the linear network coding in distributed network storage system, to increase reliability of the system. When using coding technology, the problem of repairing failed nodes will occur: if a node that stores encrypted information failed, the encrypted information needs to be constructed in a new node in order to support the same level of system reliability. This is equivalent to a partial recovery of the coding. However, the conventional error correcting code is concentrated to recover information from a sub-coding block. This will lead to new design challenges with respect to repair network load considerations. Recently, network coding technology has been helpful for these challenges. Compared to the standard error correction codes, network coding will make the bandwidth usage reduce by orders of magnitude.

Invention Case 1

Figure 2:
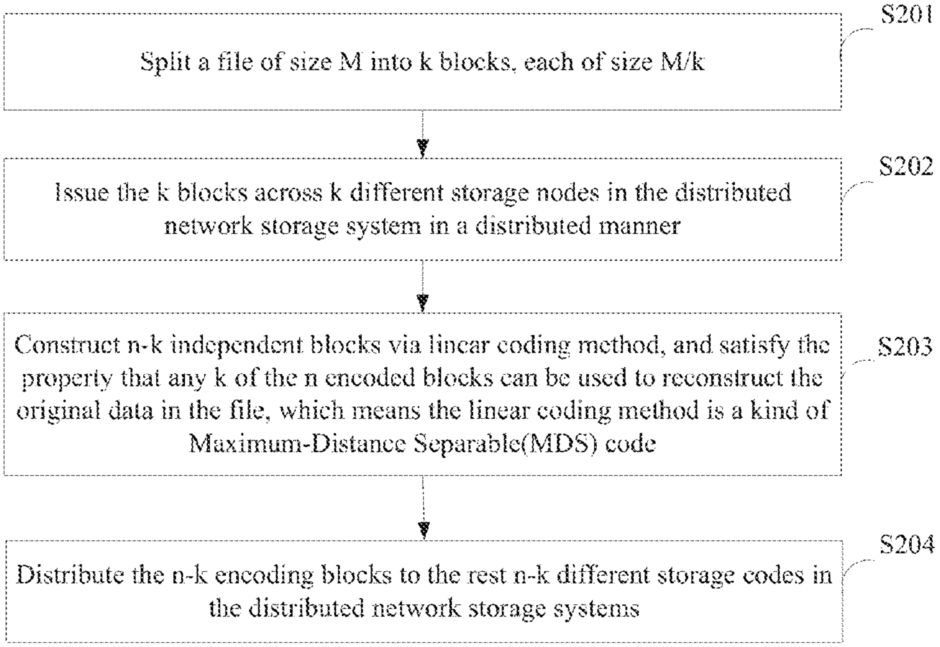
FIG. 2 illustrates the flow chart of the method of a data storage that this invention case 1 provides.

FIG. 2 illustrates the realization process of the method of data storage that present invention case 1 provided, mainly includes:

In step S201, split a file of size M into k blocks, that is to say, each block is of size M/k.

In the present embodiment, a file of size M is to be stored in the distributed network storage system. The file is first equally divided into k blocks, such that the size of each block is equal. That is to say, each block is of size M/k.

In step S202, issue the above k blocks across k different storage nodes in the distributed network storage system in a distributed manner.

In the present embodiment, k different blocks of the same size are distributed to k different nodes in the distributed network storage system. These nodes, are known as the system nodes.

In step S203, use the above k blocks, construct n−k independent blocks via linear coding method, and satisfy the property that any k of the n encoded blocks can be used to reconstruct the original data in the file, and the mentioned linear coding method is a kind of Maximum-Distance Separable (MDS) code.

In the present embodiment, randomly generate a full rank matrix of size k*(n−k) firstly, then construct n−k independent blocks by using the above k blocks and the full rank matrix. The generated blocks are the linear superposition of the original information blocks and satisfy the MDS property that any k of the n blocks are able to reconstruct the entire original file. Wherein, n, k are both positive integers, and satisfy the property that n>k. And n is the number of total nodes in distributed network storage system, while k is the least number of nodes that needed to reconstruct the original file.

In step S204, distribute the n−k encoded blocks to the rest n−k different storage nodes in the distributed network storage system.

In the present embodiment, issue the n−k encoded blocks to the rest n−k different storage nodes, and these nodes non-system nodes.

Invention Case 2

Figure 3:
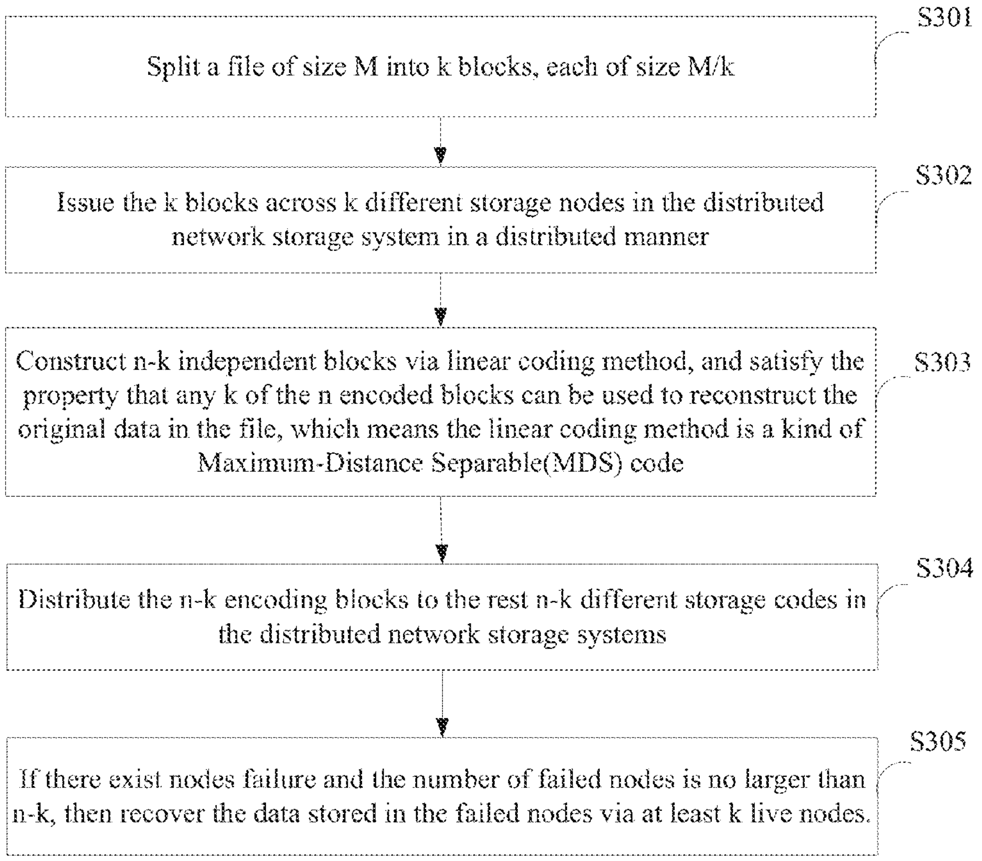
FIG. 3 illustrates the flow chart of the method of a data storage that this invention case 2 provides.

FIG. 3 illustrates the realization process of the method of data storage that present invention case 2 provided, mainly includes:

In step S301, split a file of size M into k blocks, that is to say, each block is of size M/k.

In step S302, issue the above k blocks across k different storage nodes in the distributed network storage system in a distributed manner.

In step S303, use the above k blocks, construct n−k independent blocks via linear coding method, and satisfy the property that any k of the n encoded blocks can be used to reconstruct the original data in the file, and the mentioned linear coding method is a kind of Maximum-Distance Separable (MDS) code.

In step S304, distribute the n−k encoded blocks to the rest n−k different storage nodes in the distributed network storage system.

In step S305, if there exist nodes failure and the number of failed nodes is no larger than n−k, then recover the data stored in the failed nodes via at least k live nodes.

In the present embodiment, control the nodes in the distributed network storage system, and determine whether there are nodes failed (such as hard disk damage, network disconnection, power off, etc.) and count the number of nodes that failed at the same time.

For the case that the number of failed nodes is larger than n−k, according to the MDS property, it would need at least k nodes to recover the information of the original file. And if the number of active nodes is less than k, thus the contents of the file cannot be recovered, the system just losses the file.

For the case that the number of failed nodes is no larger than n−k, according to the MDS property, related information can be obtained from the existing not less than k nodes, and recover the information that stored in the failed node through linear coding. After the repair of failed nodes, the redundancy of the system is just the same, which is still a MDS code. Thereby the reliability of the system is ensured.

The above invention case land invention case 2 are mainly applied to the MDS codes, MDS code is the best tradeoff between redundancy and reliability, because the k blocks contain the minimal information to restore the original data. In a distributed network storage system, the n different nodes (such as a disk, the server, or endpoint) that store encrypted data packet, spread all over the network, and the system can tolerate (n−k) nodes failure without loss of data.

Figure 4A:
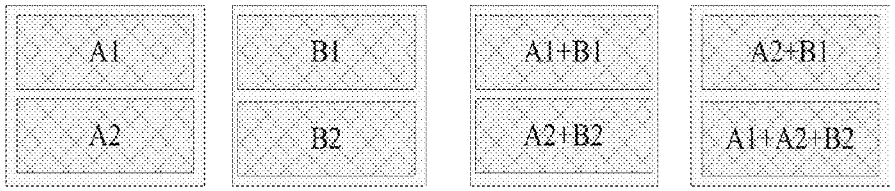
FIG. 4*a* illustrates the schematic diagram of a (4,2) MDS code that this invention case provides.

FIG. 4*a* is an example of a (4,2) MDS code. Wherein, store a file of size 4, namely A1, A2, B1, B2. Divide this file into 2 parts, each of size 2. The blocks stored on the former two nodes are uncoded, which turn out to be system nodes. What stored on the latter two nodes are the linear combinations of the original information A1, A2, B1, B2. It can be observed that arbitrary k(=2) of the n(=4) nodes can recover all the original data.

Hereinafter, the problem will be focused on that how to recover the data on the failed nodes through the no less than k existing active nodes, when there exist nodes failure and the total number of the failed nodes do not exceed n−k.

Figure 4B:
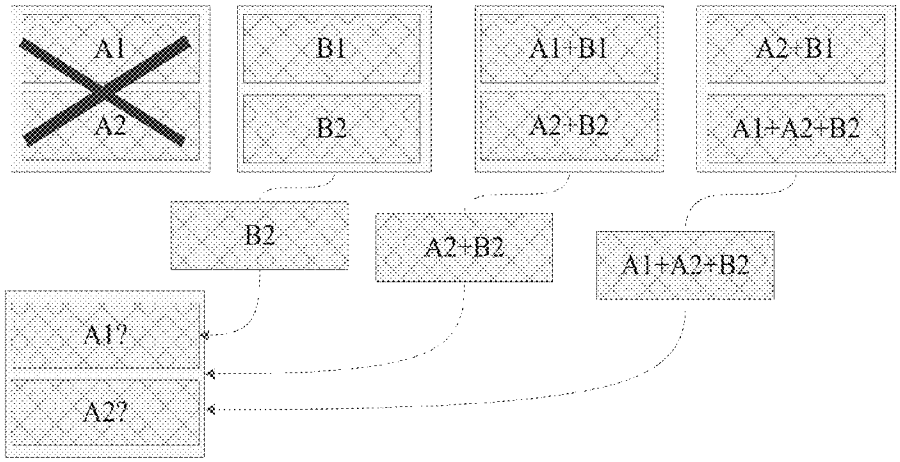
FIG. 4*b* illustrates the schematic diagram of nodes failure recovery of an MDS code that this invention case provides.

FIG. 4*b* illustrates the case when the first node failed, the newly come node can recover the lost data through the other three existing nodes. Obviously, it's much easier to repair a simple data loss than reconstruct the whole data. In this case, the original information can be recovered via communicating with the three existing nodes. More precisely, down load three blocks (B2, A2+B2, A1+A2+B2) to finish fault recovery.

Figure 4C:
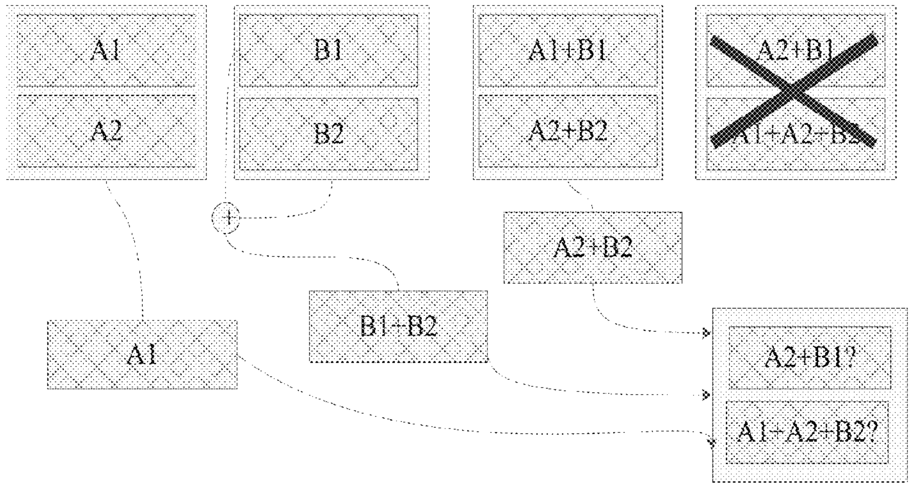
FIG. 4*c* illustrates another schematic diagram of nodes failure recovery of an MDS code that this invention case provides.

FIG. 4*c* illustrates the repair of the fourth storage node. This can be achieved by using only three blocks but one key difference is that the second node needs to compute a linear combination of the stored packets B1, B2 and the actual communicated block is B1+B2. This shows clearly the necessity of network coding, creating linear combinations in intermediate nodes during the repair process.

If the network bandwidth is more critical resource compared to disk access, as is often the case, an important consideration is to find what is the minimum required bandwidth and which codes can achieve it.

In the repair examples shown in FIG. 4, the newcomer constructs exactly the two blocks that were in failed node. Note, however, that the definition of repair only requires that the new node forms an (n, k) MDS code property (that any k nodes out of n suffice to recover the original whole data), when combined with existing nodes. In other words, the new node could be forming new linear combinations that were different from the ones in the lost node, a requirement that is strictly easier to satisfy.

Figure 5:
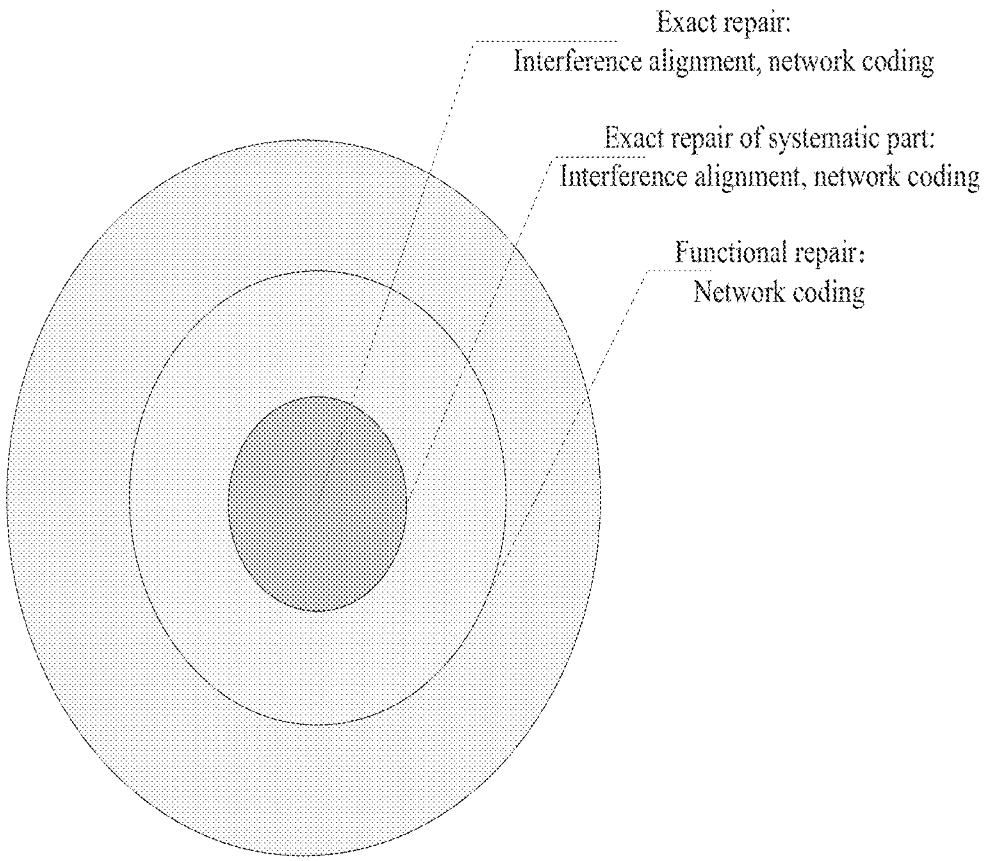
FIG. 5 illustrates the schematic diagram of different versions of repair and main techniques that this invention case provides.

Thus there are three versions of repair have been considered in the method that recovering the data stored in the failed node through no less than k live nodes, as illustrated in FIG. 5: exact repair, functional repair, and hybrid repair (exact repair of systematic parts). In functional repair, it's advisable as long as the newly generated blocks maintain the MDS code property. It can be reduced to a multicasting problem on an appropriately constructed graph called the information flow graph, thus network coding is the mainly used technology. In exact repair, the failed blocks are exactly regenerated, which mainly use network coding and interference alignment. The exact repair of the systematic part is a hybrid repair model lying between exact repair and functional repair. It is required that the systematic blocks are exactly repaired upon failures and the nonsystematic parts follow a functional repair model. It can be viewed as a relax from the exact repair, thus the technologies mainly used are network coding and interference alignment.

Wherein, functional repair is: data contained in the blocks of the new nodes, which is constructed via linear network coding technique, is not exactly the same as it stored in the failed nodes, while the MDS property is maintained in the distributed network system after repair.

Specifically, functional repair includes:

Download $\beta$ bits coding message from arbitrary d live nodes, and repair the data stored in the failed nodes via linear network coding;

Wherein, $d \leq n-1$, n is the number of total nodes in the distributed network storage system.

The detailed description of functional repair is listed as follows:

The functional repair problem can be represented as multicasting over an information flow graph. The information flow graph represents the evolution of information flow as nodes join and leave the storage network. For any node that stores $\alpha \geq \alpha^*(n,k,d,\gamma)$, the points $(n,k,d,\alpha,\gamma)$ are feasible and linear network codes suffice to achieve them.

It is information theoretically impossible to achieve points with $\alpha < \alpha^*(n,k,d,\gamma)$, The threshold function $a^*(n,k,d,\gamma)$ is the following:

$$\alpha^*(n,k,d,\gamma) = \begin{cases} \frac{M}{k}, & \gamma \in [f(0), +\infty] \\ \frac{M - g(i)\gamma}{k-i}, & \gamma \in [f(i), f(i-1)) \end{cases} \quad (1)$$

$$f(i) = \frac{2Md}{(2k-i-1)i + 2k(d-k+1)} \quad (2)$$

$$g(i) = \frac{(2d-2k+i+1)}{2d} \quad (3)$$

where $d \leq n-1$. Given (n,k,d), the minimum repair bandwidth $\gamma$ is $$\gamma_{min} = f(k-1) = \frac{2Md}{2kd - k^2 + k}. \quad (4)$$

One important observation is that the minimum repair bandwidth $\gamma = d\beta$ is a decreasing function of the number d of nodes that participate in the repair. While the newcomer communicates with more nodes, the size of each communicated packet $\beta$ becomes smaller fast enough to make the product $d\beta$ decrease. Therefore, the minimum repair bandwidth can be achieved when $d=n-1$.

As we mentioned, code repair can be achieved if and only if the underlying information flow graph has sufficiently large min-cut. This condition leads to the repair rates computed in formula (1) to formula (4). And when these conditions are met, simple random linear combinations will make the system end up with high reliability as the field size over which coding is performed grows.

We take two kinds of codes into consideration, namely minimum-storage regenerating (MSR) codes and minimum-bandwidth regenerating (MBR) codes. According to the above formula (1) to formula (4), it can be verified that the minimum storage point is achieved:

$$(\alpha_{MSR}, \gamma_{MSR}) = \left(\frac{M}{k}, \frac{Md}{k(d-k+1)}\right). \quad (5)$$

As discussed, the repair bandwidth $\gamma_{MSR} = d/\beta_{MSR}$ is a decreasing function of the number of nodes d that participate in the repair. Since the MSR codes store M/k bits at each node while ensuring the MDS-code property, they are equivalent to standard MDS code. Observe that when d=k, the total communication for repair is M (the size of the original file). Therefore, if a newcomer is allowed to contact only k nodes, it is inevitable to download the whole data object to repair one new failure and this is the naive repair method that can be performed for any MDS codes.

However, allowing a newcomer to contact more than k nodes, MSR codes can reduce the repair bandwidth $\gamma_{MSR}$, which is minimized when $d=n-1$, $$(\alpha_{MSR}, \gamma_{MSR}^{min}) = \left(\frac{M}{k}, \frac{M}{k} \cdot \frac{n-1}{n-k}\right). \quad (6)$$

We have separated the M/k factor in $\gamma_{MSR}^{min}$ to illustrate that MSR codes communicate an $(n-1)(n-k)$ factor more than what they store. This represents a fundamental expansion necessary for MDS constructions that are optimal on the reliability-redundancy tradeoff. For example, consider a (n,k)=(14,7) code. In this case, the new-comer needs to download only M/49 bits from each of the $d=n-1=13$ active storage nodes, making the repair bandwidth equal to (M/7)·(13/7). Notice that we need only an expansion factor of 13/7, while a factor of 7 is required for the naive repair method.

At the other end of the tradeoff are MBR codes, which have minimum repair bandwidth. It can be verified that the minimum repair bandwidth point is achieved by $$(\alpha_{MBR}, \gamma_{MBR}) = \left(\frac{2Md}{2kd - k^2 + k}, \frac{2Md}{2kd - k^2 + k}\right), \quad (7)$$

Note that in the minimum band width regenerating codes, the storage size $\alpha$ is equal to $\gamma$, the total number of bits communicated during repair. If we set the optimal value $d=n-1$, we obtain $$(\alpha_{MBR}^{min}, \gamma_{MBR}^{min}) = \left(\frac{M}{k} \cdot \frac{2n-2}{2n-k-1}, \frac{M}{k} \cdot \frac{2n-2}{2n-k-1}\right). \quad (8)$$

Figure 6:
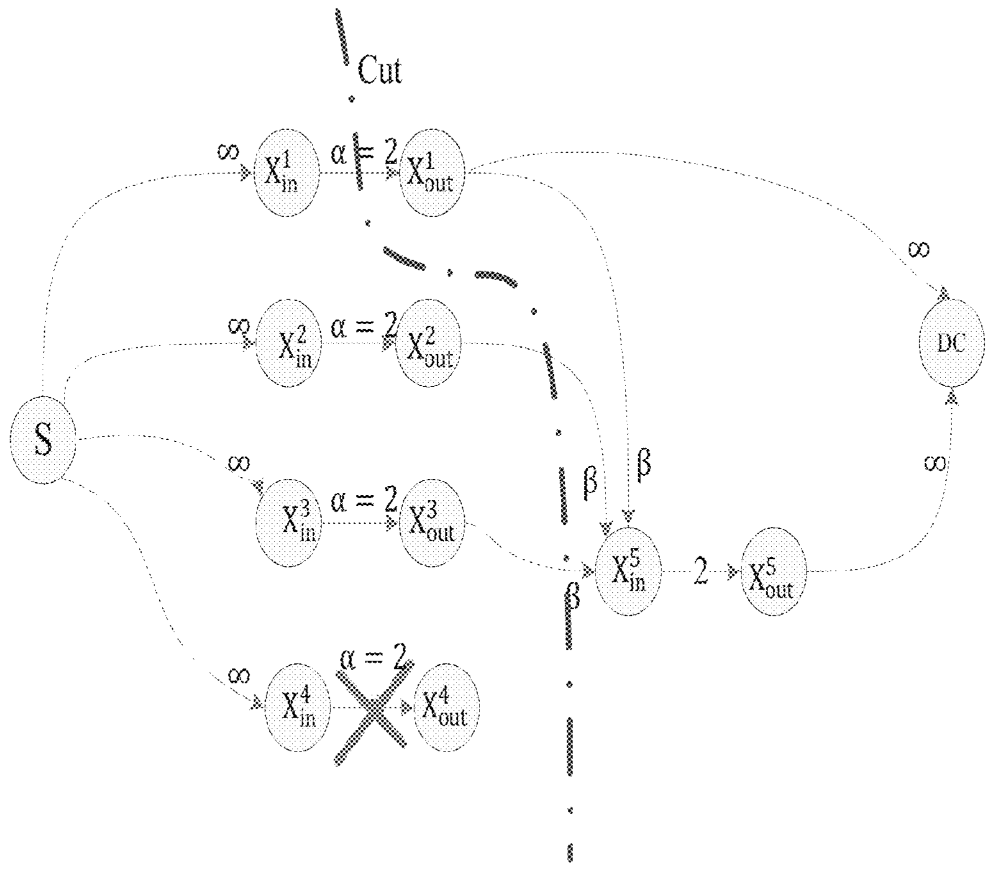
FIG. 6 illustrates the information process schematic diagram of the functional repair of a (4,2) MDS code that this invention case provides.

Notice that $\alpha_{MBR}^{min} = \gamma_{MBR}^{min}$: MBR codes incur no repair bandwidth expansion at all, just like a replication system does, downloading exactly the amount of information stored during a repair. However, MBR codes require an expansion factor of (2n−2)/(2n−k−1) in the amount of stored information and are no longer optimal in terms of their reliability for the given redundancy. FIG. 6 gives an example of an information flow graph of an (4, 2) MDS code. In this FIG. 6, each storage node is represented by a pair of nodes $X^i_{in}$ and $X^i_{out}$ connected by an edge whose capacity is the storage capacity of the node. There is a virtual source node s corresponding to the origin of the data object. Suppose initially we store a file of size M=4 blocks at four nodes, where each node stores $\alpha$=2 blocks and the file can be reconstructed from any two nodes. Virtual sink nodes called data collectors connect to any k node subsets and ensure that the code has the MDS property (that any k out of n suffices to recover). Suppose storage node 4 fails, then the goal is to create a new storage node, $X^5_{in}$, which communicates the minimum amount of information and then stores $\alpha$=2 blocks. node $X^5_{in}$ is connected to the d=3 active storage nodes. Assuming $\beta$ bits communicated from each active storage node, of interest is the minimum $\beta$ required. The min-cut separating the source and the data collector must be larger than M=4 blocks for regeneration to be possible. For FIG. 6, the min-cut value is given by $\alpha+2\beta$, implying that communicating $\beta\geq1$ block is sufficient and necessary. The total repair bandwidth to repair one failure is therefore $\gamma=d/\beta=3$ blocks.

An information flow graph corresponds to a particular evolution of the distributed network storage system after a certain number of failures/repairs. We call each failure/repair a "stage": in each stage, a single storage node fails and the code gets repaired by down-loading $\beta$ bits each from any d surviving nodes. Therefore, the total repair bandwidth is $\gamma=d\beta$. As the Example shown in FIG. 6, In the initial stage, the system consists of nodes 1, 2, 3, and 4; in the second stage, the system consists of nodes 2, 3, 4 and 5.

Figure 7:
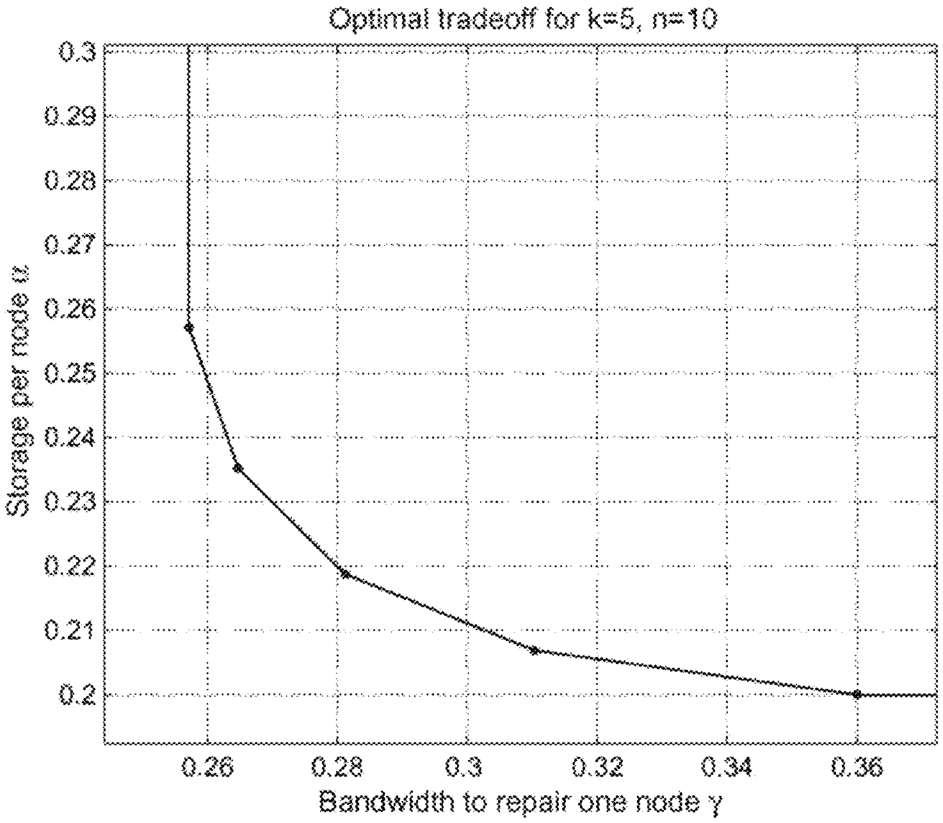
FIG. 7 illustrates the schematic diagram of the optimal tradeoff curve of node storage $\alpha$ and repair bandwidth $\gamma$ that this invention case provides.

As we mentioned, code repair can be achieved if and only if the underlying information flow graph has sufficiently large min-cut. And simple random linear combinations will end up with high reliability as the field size over which coding is performed grows. According to formula (1) to formula (4), FIG. 7 shows the optimal tradeoff curve between storage $\alpha$ and repair bandwidth $\gamma$, for the case (k=5, n=10). Here M=1 and d=n−1. Note that traditional erasure coding corresponds to the point ($\alpha$=0.2, $\gamma$=1) for the optional tradeoff curve of parameter (k=5, n=10).

It is of interest to study the two extremal points on the optimal tradeoff curve, which correspond to the best storage efficiency and the minimum repair bandwidth, respectively. We call codes that attain these points minimum-storage regenerating (MSR) codes and minimum-bandwidth regenerating (MBR) codes, respectively.

As we discussed, the repair-storage tradeoff for functional repair can be completely characterized by analyzing the cutset of the information flow graphs. However, as mentioned earlier, functional repair is of limited practical interest since there is a need to maintain the code in systematic form. Also, under functional repair, significant system overhead is incurred in order to continually update repairing-and-decoding rules whenever a failure occurs. Moreover, the random-network-coding-based solution for the function repair can require a huge finite-field size to support a dynamically expanding graph size (due to continual repair). This can significantly increase the computational complexity of encoding and decoding. Furthermore, functional repair is undesirable in storage security applications in the face of eavesdroppers. In this case, information leakage occurs continually due to the dynamics of repairing-and-decoding rules that can be potentially observed by eavesdroppers. These drawbacks motivate the need for exact repair of failed nodes.

Wherein, exact repair is: data stored in the blocks of the new nodes, which is constructed via linear network coding technique and interference alignment, is exactly regenerated which means restoring exactly the lost blocks with their replicas.

Specifically, exact repair includes:

Download $\beta$ bits coding message from arbitrary d live nodes, and repair the data stored in the failed nodes via linear network coding.

The dimension of the newly generated nodes' interference reduces through linear array;

Wherein, for the Minimum-bandwidth Regenerating (MBR) codes, d=n−1; for the Minimum-storage Regenerating (MSR) codes, $d\in[2k-1,n-1]$, $k/n\leq\frac{1}{2}$, n is the number of total nodes in distributed network storage system.

Figure 8:
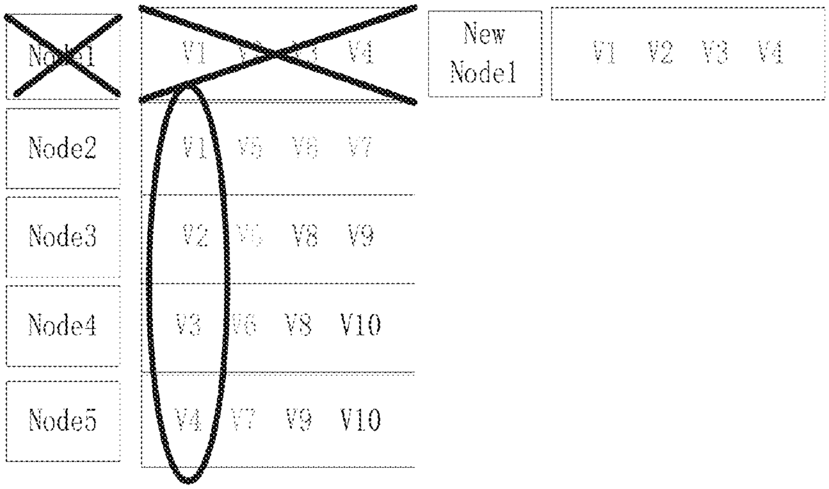
FIG. 8 illustrates the schematic diagram of the exact repair of a (5,3) MBR code that this invention case provides.

Wherein, the detailed description of exact repair is listed as follows:

For Exact-MBR codes, the cutset lower bound of can be achieved with a deterministic scheme that requires a finite-field alphabet size of at most (n−1)n/2 when d=n−1. FIG. 8 illustrates an idea through the example of $(n,k,d,\alpha,\gamma)=(5,3,4,4,4)$ where the maximum file size of M=9 (matching the cutset bound) can be stored. Each node stores four blocks with the form of $a^t v_i$, where $v_i$ can be interpreted as a 1-D subspace of data file. We simply write only subspace vector to represent an actually stored block. Notice that the degree d is equal to the number of storage blocks to be repaired, i.e., the number of available equations matches the number of desired variables for exact repair of a single node. Hence, for exact repair, there must be at least one duplicated block between node 1 and node i for all $i\neq1$.

The idea is to have other nodes i (i #1) store each block of node 1, respectively: nodes 2, 3, 4, and 5 store $a^t v_1$, $a^t v_2$, $a^t v_3$, and $a^t v_4$ in its own place, respectively. Notice that for ensuring repair, it suffice s to have only one duplicated block between any two storage nodes. Hence, node 2 can store another new three blocks of $a^t v_5$, $a^t v_6$, and $a^t v_7$ in the remaining other places. In accordance with the above procedure, nodes 3, 4, and 5 then copy each of three blocks in their space, respectively. We repeat this procedure until 10=(4+3+2+1) blocks are stored in total. One can see that this construction guarantees exact repair of any failed node, since at least one block is duplicated between any two storage nodes and also the duplicated block is distinct.

The remaining issue is now to design these ten subspace vectors $v_i$, i=1, . . . , 10. The detailed construction comes from the MDS-code property that any three nodes out of five need to recover the whole data file. Observe in FIG. 8 that nine distinct vectors can be downloaded from any three nodes. Hence, any (10,9) MDS code can construct these $v_i$. In this example, using the parity-check code defined over GF(2), we can design the $v_i$ as follows: $v_i=e_i$, $\forall i=1, \ldots, 9$ and $v_{10}=[1, \ldots, 1]^t$. And this idea can be extended to an arbitrary (n, k) case. This construction can be interpreted as an optimal interference avoidance technique. To see this, observe in the figure that the number of desired blocks for exact repair matches the number of available equations that can be downloaded. Hence, the involvement of any undesired blocks (interference) precludes exact repair.

Figure 9:
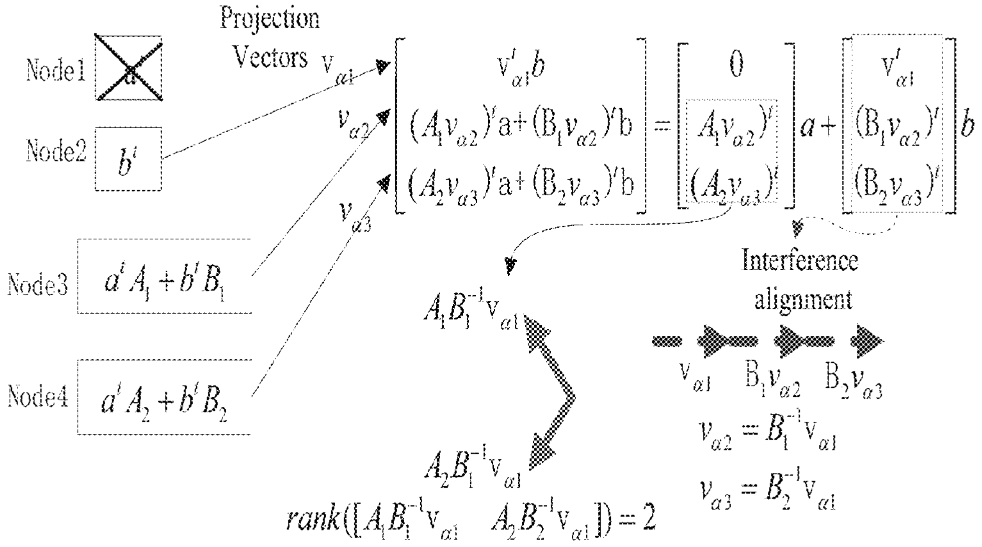
FIG. 9 illustrates the schematic diagram of the exact repair of a (4,2) MSR code that this invention case provides.
Figure 10:
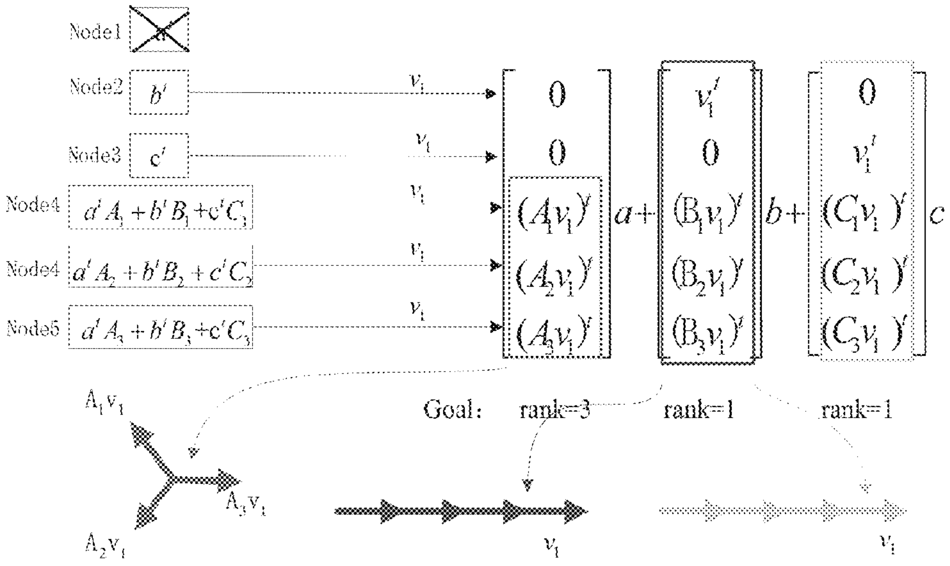
FIG. 10 illustrates the schematic diagram of the exact repair of a (6,3) MBR code that this invention case provides.

Even though this interference-avoidance provides solutions to MBR codes, the data stored on one node is very large, it can't satisfy MSR codes. Thus it turns out that a new idea is needed for MSR nodes. The new idea is interference alignment. And the idea of interference alignment is to align multiple interference signals in a signal subspace whose dimension is smaller than the number of interferers. FIG. 9 illustrates interference alignment for exact repair of failed node 1 for $(n,k,d,\alpha,\gamma)=(4,2,3,2,2)$ where the maximum file size of M=4 can be stored. We introduce matrix notation for illustration purposes. Let $a=(a_1,a_2)^t$ and $b=(b_1,b_2)^t$ be 2-D information-unit vectors. Let $A_i$ and $B_i$ be 2-by-2 encoding matrices for parity node i (i=1,2), which contain encoding coefficients for the linear combination of $(a_1,a_2)$ and $(b_1,b_2)$, respectively. For example, parity node 1 stores blocks in the form of $a^tA_1+b^tB_1$, as shown in FIG. 9. The encoding matrices for systematic nodes are not explicitly defined since those are trivially inferred. Finally, we define 2-D projection vectors $v_{\alpha i}$'s (i=1, 2, 3) because of $\beta=1$.

Let us explain the interference-alignment scheme through the example shown by FIG. 9. First, two blocks in each storage node are projected into a scalar with projection vectors $v_{\alpha i}$'s. By connecting to three nodes, we get $v_{\alpha 1}{}^tb$; $(A_1v_{\alpha 2})^ta+(B_1v_{\alpha 2})^tb$; $(A_2v_{\alpha 3})^ta+(B_2v_{\alpha 3})^tb$. Here the goal is to decode two desired unknowns out of three equations including four unknowns. To achieve this goal, we need $$\text{rank}\left(\begin{bmatrix}(A_1v_{\alpha 2})^t\\(A_2v_{\alpha 3})^t\end{bmatrix}\right)=2$$

$$\text{rank}\left(\begin{bmatrix}v_{\alpha 1}^t\\(B_1v_{\alpha 2})^t\\(B_2v_{\alpha 3})^t\end{bmatrix}\right)=1.$$

The second condition can be met by setting $v_{\alpha 2}=B_1^{-1}v_{\alpha 1}$ and $v_{\alpha 3}=B_2^{-1}v_{\alpha 1}$. This choice forces the interference space to be collapsed into a 1-D linear subspace, thereby achieving interference alignment. On the other hand, we can satisfy the first condition as well by carefully choosing the $A_i$'s and $B_i$'s. For exact repair of node 2, we can apply the same idea.

In order to achieve the cutset bound of exact repair for arbitrary (k/n)≤(½), we use the simultaneous interference alignment. FIG. 9 illustrates the interference alignment technique through the example of $(n,k,d,\alpha,\gamma)=(6,3,5,3,3)$ where M=9. Let $a=(a_1,a_2,a_3)^t$, $b=(b_1,b_2,b_3)^t$ and $c=(c_1,c_2,c_3)^t$ be 3-D information-unit vectors. Let $A_i$, $B_i$ and $C_i$ be 3-by-3 encoding matrices for parity node i (i=1, 2, 3). We define 3-D projection vectors $v_{\alpha i}$'s (i=1, . . . , 5). When node 1 failed, we get five equations by connecting to five nodes. In order to successfully recover the desired signal components of a, the matrix associated with a should have full rank of 3, while the other matrices corresponding to b and c should have rank 1, respectively. In accordance with the (4, 2) code example in FIG. 9, if one were to set $v_{\alpha 3}=B_1^{-1}v_{\alpha 1}$, $v_{\alpha 4}=B_2^{-1}v_{\alpha 2}$ and $v_{\alpha 5}=B_3^{-1}v_{\alpha 1}$, then it is possible to achieve interference alignment with respect to b. However, this choice also specifies the interference space of c. If the $B_i$'s and $C_i$'s are not designed judiciously, interference alignment is not guaranteed for c. Hence, it is not evident how to achieve interference alignment at the same time.

In order to address the challenge of simultaneous interference alignment, a common eigenvector concept is invoked. The idea consists of two parts: 1) designing the $(A_i, B_i, C_i)$'s such that $v_1$ is a common eigenvector of the $B_i$'s and $C_i$'s, but not of $A_i$'s[3]; and 2) repairing by having survivor nodes project their data onto a linear subspace spanned by this common eigenvector $v_1$. We can then achieve interference alignment for b and c at the same time, by setting $v_{\alpha i}=v_1$, ∀i. As long as $[A_1v_1, A_2v_1, A_3v_1]$ is invertible, we can also guarantee the decodability of a.

The challenge is now to design encoding matrices to guarantee the existence of a common eigenvector while also satisfying the decodability of desired signals. The difficulty comes from the fact that in the (6,3,5) code example, these constraints need to be satisfied for all six possible failure configurations. The structure of elementary matrices (generalized matrices of Householder and Gauss matrices) gives insights into this. To see this, consider a 3-by-3 elementary matrix A: $A=uv^t+\alpha I$, where u and v are 3-D vectors. Note that the dimension of the null space of v is 2 and the null vector $v^t$ is an eigenvector of A, i.e., $Av^t=\alpha v^t$. This motivates the following structure:

$$A_1=u_1v_1{}^t+\alpha_1I, A_2=u_2v_1{}^t+\alpha_2I, A_3=u_3v_1{}^t+\alpha_3I$$

$$B_1=u_1v_2{}^t+\beta_1I, B_2=u_2v_2{}^t+\beta_2I, B_3=u_3v_2{}^t+\beta_3I$$

$$C_1=u_1v_3{}^t+\gamma_1I, C_2=u_2v_3{}^t+\gamma_2I, C_3=u_3v_3{}^t+\gamma_3I$$

where $v_i$'s are 3-D linearly independent vectors and so are $u_i$'s. The values of the $\alpha_i$'s, $\beta_i$'s and $\gamma_i$'s can be arbitrary nonzero values. For simplicity, we consider the simple case where the $v_i$'s are orthonormal, although these need not be orthogonal, but only linearly independent. We then see that ∀i=1, 2, 3

$$\alpha_iv_1+u_i, B_iv_1=\beta_iv_1, C_iv_1=\gamma_iv_1.$$

Importantly, notice that $v_1$ is a common eigenvector of the $B_i$'s and $C_i$'s, while simultaneously ensuring that the vectors of $A_iv_1$ are linearly independent. Hence, setting $v_{\alpha i}=v_1$ for all i, it is possible to achieve simultaneous interference alignment while also guaranteeing the decodability of the desired signals. On the other hand, this structure also guarantees exact repair for b and c. We use $v_2$ for exact repair of b. It is a common eigenvector of the $C_i$'s and $A_i$'s, while ensuring $[B_1v_2, B_2v_2, B_3v_2]$ invertible. Similarly, $v_3$ used for c.

Parity nodes can be repaired by drawing a dual relationship with systematic nodes. The procedure has two steps. The first is to remap parity nodes with a', b' and c', respectively. Systematic nodes can then be rewritten in terms of the prime notations:

$$a^t=a'^t+A'_1+b'^tB'_1+c'^tC'_1, b^t=a'^tA'_2+b'^tB'_2+c'^tC'_2, c^t=a'^tA'_3+b'^tB'_3+c'^tC'_3$$

where the newly mapped encoding matrices $(A_i', B_i', C_i')$'s are defined as $$\begin{bmatrix}A_1' & A_2' & A_3'\\B_1' & B_2' & B_3'\\C_1' & C_2' & C_3'\end{bmatrix}:=\begin{bmatrix}A_1 & A_2 & A_3\\B_1 & B_2 & B_3\\C_1 & C_2 & C_3\end{bmatrix}^{-1}.$$

With this remapping, one can dualize the relationship between systematic and parity node repair. Specifically, if all of the $A_i$'s, $B_i$'s and $C_i$'s are elementary matrices and form a similar code structure, exact repair of the parity nodes becomes transparent. It was shown that a special relationship between $[u_1,u_2,u_3]$ and $[v_1,v_2,v_3]$ through the correct choice of $(\alpha_i,\beta_i,\gamma_i)$'s can also guarantee the dual structure.

Wherein, hybrid repair is: if the failed nodes in the distributed network storage systems are systematic nodes, then data stored in the blocks of the new nodes, which is constructed via linear network coding technique and interference alignment, is exactly regenerated; if the failed nodes in the distributed network storage systems are non-systematic nodes, then data stored in the blocks of the new nodes, which is constructed via linear network coding technique, isn't the same with the lost blocks of the failed nodes while satisfies MDS property in the distributed network system after repair.

Specifically, hybrid repair includes:

Download β bits coding message from arbitrary d live nodes, and repair the data stored in the failed nodes via linear network coding;

The dimension of the newly generated nodes' interference reduces through linear array;

Wherein, d=k+1, k is the least number of nodes that needed to reconstruct the original file, n is the number of total nodes in distributed network storage system.

Figure 11:
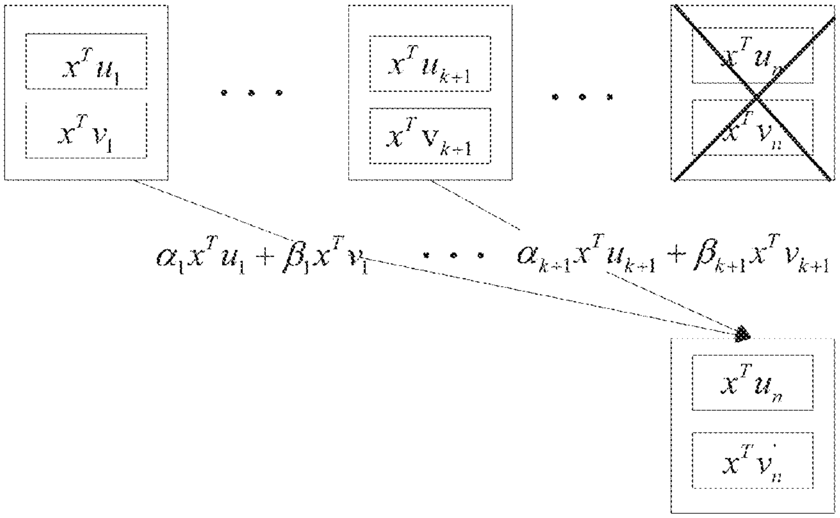
FIG. 11 illustrates the schematic diagram of the exact repair of systematic parts that this invention case provides.

In practice, hybrid repair is the repair between functional repair and exact repair, namely the system parts need exact repair, which means that the system nodes adopt exact repair while the non-system nodes only need functional repair. Derived from [Y. Wu. (2009, August). A construction of systematic MDS codes with minimum repair bandwidth. IEEE Trans. Inf. Theory], a construction of systematic (n, k) MDS codes for n≥2k achieves the minimum repair bandwidth when repairing from k+1 nodes. FIG. 11 illustrates the construction scheme of this repair. In FIG. 11, $x \in F^{2k}$ is a vector consisting of the 2k original information symbols. Each node stores two symbols $x^T u_i$ and $x^T v_i$. The vectors $\{u_i\}$ do not change over time but $\{v_i\}$ change as the code repairs. We maintain the invariant property that the 2n length-2k vectors $\{v_i, u_i\}$ form an (2n, 2k)-MDS code; that is, any 2k vectors in the set $\{v_i, u_i\}$ have full rank 2k. This certainly implies that the n nodes form an (n, k)-MDS code. We initialize the code using any (2n, 2k) systematic MDS code over F.

Now we consider the situation of a repair. Without loss of generality, suppose node n failed and is repaired by accessing nodes 1, . . . , k+1. As illustrated in FIG. 11, the replacement node downloads $\alpha_i x^T u_i + \beta_i x^T v_i$ each node of $\{1, \ldots, k+1\}$. Using these k+1 downloaded symbols, the replacement node computes two symbols $x^T u_n$ and $x^T v'_n$ as follows:

$$\sum_{i=1}^{k+1} (\alpha_i x^T u_i + \beta_i x^T v_i) = x^T u_n$$

$$\sum_{i=1}^{k+1} \rho_i (\alpha_i x^T u_i + \beta_i x^T v_i) = x^T v'_n$$

Note that $v_n'$ is allowed to be different from $v_n$; the property that we maintain is that the repaired code continues to be an (2n, 2k)-MDS code. Here $\{\alpha_i, \beta_i, \rho_i\}$ and $v_n'$ are the variables that we can control. And we can choose these variables so that the repaired code continues to be an (2n, 2k)-MDS code.

Invention Case 3

Figure 12:
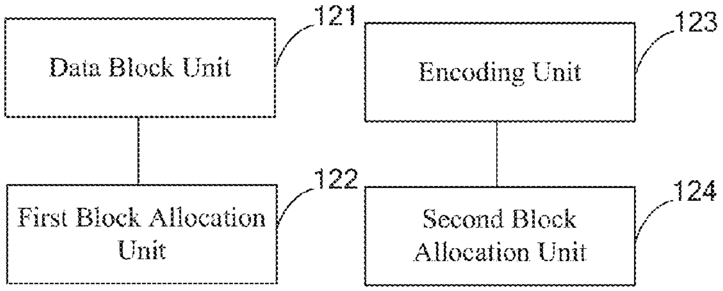
FIG. 12 illustrates structure diagram of a data storage device that this invention case 3 provides.

FIG. 12 illustrates the specific structure diagram of data storage that present invention case 3 provided. In order to facilitate the explanation, we only show the portion that associated with this embodiment of the invention. And the device is able to achieve the method of the above-described invention case 1. The nodes and index server of the device in the network storage system, along with clients, can constitute the system shown in FIG. 1. In this invention case, the device includes: data block unit 121, the first block allocation unit 122, encoding unit 123, the second block allocation unit 124.

Wherein, the data block unit 121, is used to split a file of size M into k blocks, each block is of size M/k;

The first block allocation unit 122, is used to issue the k blocks into k different nodes in the distributed network storage system;

The encoding unit 123, is used to construct n−k independent blocks via linear coding from the k blocks, and satisfies the property that arbitrary k of the n encoded blocks can be used to reconstruct the original data, which means the linear coding method is a kind of Maximum-Distance Separable (MDS) code;

The second block allocation unit 124, is used to issue the n−k encoding blocks into the rest n−k different storage codes in the distributed network storage systems.

Wherein, n, k are both positive integers, and satisfy n>k. And n is the number of total nodes in distributed network storage system, while k is the least number of nodes that needed to reconstruct the original file.

The device of data storage that present invention case provided can be used in the preceding corresponding method embodiment (invention case 1). You can refer to the methods shown in FIG. 2 for specific details, we will not go further on this device here.

Invention Case 4

Figure 13:
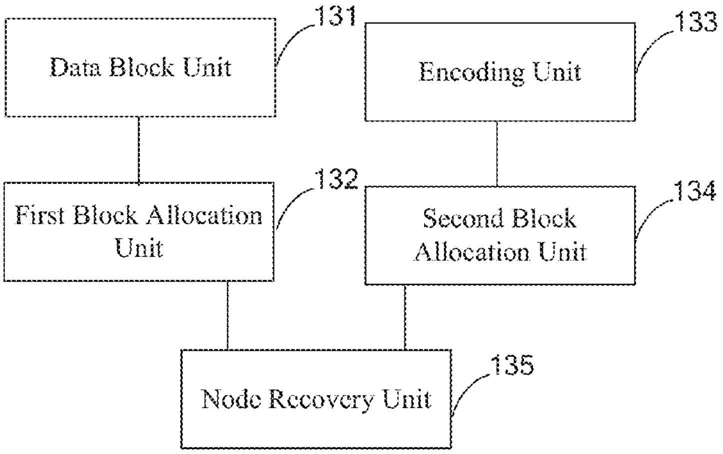
FIG. 13 illustrates structure diagram of a data storage device that this invention case 4 provides.

FIG. 13 illustrates the specific structure diagram of data storage that present invention case 4 provided. In order to facilitate the explanation, we only show the portion that associated with this embodiment of the invention. And the device is able to achieve the method of the above-described invention case 2. The nodes and index server of the device in the network storage system, along with clients, can constitute the system shown in FIG. 1. In this invention case, the device includes: data block unit 131, the first block allocation unit 132, encoding unit 133, the second block allocation unit 134 and node recovery unit 135.

Wherein, the data block unit 131, is used to split a file of size M into k blocks, each block is of size M/k;

The first block allocation unit 132, is used to issue the k blocks into k different nodes in the distributed network storage system;

The encoding unit 133, is used to construct n−k independent blocks via linear coding from the k blocks, and satisfies the property that arbitrary k of the n encoded blocks can be used to reconstruct the original data, which means the linear coding method is a kind of Maximum-Distance Separable (MDS) code;

The second block allocation unit 134, is used to issue the n−k encoding blocks into the rest n−k different storage codes in the distributed network storage systems.

Wherein, n, k are both positive integers, and satisfy n>k. And n is the number of total nodes in distributed network storage system, while k is the least number of nodes that needed to reconstruct the original file.

The node recovery unit 135, is used in the situation when there are nodes failure and the number of failed nodes is no larger than n−k, then recover the data stored in the failed nodes via at least k live nodes.

Wherein, the node recovery unit 135 includes at least one block from the three functional repair block, exact repair block, hybrid repair block:

The functional repair block, is used in the situation that data contained in the blocks of the new nodes, which is constructed via linear network coding technique, is not exactly the same as it stored in the failed nodes, while the MDS property is maintained in the distributed network system after repair;

The exact repair block, is used in the situation that data stored in the blocks of the new nodes, which is constructed via linear network coding technique and interference alignment, is exactly regenerated which means restoring exactly the lost blocks with their replicas;

The hybrid repair block, is used in two situations: if the failed nodes in the distributed network storage systems are systematic nodes, then data stored in the blocks of the new nodes, which is constructed via linear network coding technique and interference alignment, is exactly regenerated; If the failed nodes in the distributed network storage systems are non-systematic nodes, then data stored in the blocks of the new nodes, which is constructed via linear network coding technique, isn't the same with the lost blocks of the failed nodes while satisfies MDS property in the distributed network system after repair.

Wherein, the functional repair block includes:

The first coding sub-block, is used to download β bits coding message from arbitrary d live nodes, and repair the data stored in the failed nodes via linear network coding. Wherein, d≤n−1, n is the number of total nodes in distributed network storage system;

The exact repair block includes:

The second coding sub-block, is used to download β bits coding message from arbitrary d live nodes, and repair the data stored in the failed nodes via linear network coding; Wherein, for MBR codes, d=n−1; for MSR codes, d∈[2k−1, n−1], k/n≤½, n is the number of total nodes in distributed network storage system;

The first interference alignment sub-block, is used to reduce the dimension of the newly generated nodes' interference through linear array;

The hybrid repair block includes:

The third coding sub-block, is used to download β bits coding message from arbitrary d live nodes, and repair the data stored in the failed nodes via linear network coding; Wherein, d=k+1, k is the least number of nodes that needed to reconstruct the original file;

The second interference alignment sub-block, is used to reduce the dimension of the newly generated nodes' interference through linear array.

The device of data storage that present invention case provided can be used in the preceding corresponding method embodiment (invention case 2). You can refer to the methods shown in FIG. 3 for specific details, we will not go further on this device here.

In the present invention case, we split a file into k blocks and store them in k nodes. Then we use the k blocks, construct n−k independent blocks via linear coding (Maximum-Distance Separable, MDS), and satisfy the property that any k of the n encoded blocks can be used to reconstruct the original data in the file. After that, we distribute the n−k coded blocks to the n−k different storage codes in the distributed network storage systems. This enables the distributed network storage system tolerates at most n−k simultaneous failures of nodes without losing data, keeps the redundancy of system in an invariant level, and ensures the reliability of the distributed network storage system. In addition, when there are nodes failed, three versions of repair are all taken into consideration, thus reduce the repair load as well as data stored on each node. The functional repair problem is in essence a problem of multicasting from a source to an unbounded number of receivers over an unbounded graph. As we showed there is a tradeoff between storage and repair bandwidth and the two extremal points are achieved by MBR and MSR codes. The repair bandwidth is characterized by the min-cut bounds. Problems that require exact repair correspond to network coding problems having sinks with overlapping sub-set demands. For MBR codes, the repair bandwidth given by the cutset bound is achievable for the interesting case of d=n−1. And for MSR codes, the cutset bound can be matched when d∈[2k−1,n−1], d≤n−1. The hybrid repair is just a construction of an (n, k) MDS code for the case that n≥2k, and the minimum repair bandwidth can be achieved when communicating with d=k+1 nodes.

All described above, is only a preferred embodiment for the purpose of the present invention, and not limited to the present invention. Where any modifications, equivalent substitutions, and improvements, etc., made within the spirit and principle of the present invention, should be included in the protection of the invention range.

What is claimed is:

1. A method of storing data, comprising:

splitting a file of size M into k blocks, wherein M is a measure of an amount of data in the file and k is a positive integer and is the smallest number of nodes required to reconstruct the file and such that each block is of size M/k;

distributing the k blocks across k first storage nodes in a distributed network storage system via a first block allocation device;

constructing n-k independent blocks via a linear coding method employing a Maximum-Distance Separable (MDS) code, where n is a total number of nodes in the distributed network storage system and n>k and satisfying that any k of the n encoded blocks can reconstruct the original data in the file;

distributing the n-k encoded blocks to n-k different second storage nodes in the distributed network storage systems via a second block allocation device;

determining that nodes have failed and that no more than n-k first and second nodes have failed; and recovering data stored in failed first and second nodes by a node recovery device through linear encoding via at least k intact nodes, wherein data in the failed first nodes is exactly regenerated with interference alignment and wherein data in the failed second nodes is regenerated maintaining a MDS code property.

2. A data storage device comprising:

a data block device which splits a file of size M into k blocks, wherein M is a measure of an amount of data in the file and k is a positive integer and is the smallest number of nodes required to reconstruct the file, where each block is of size M/k;

a first block allocation device which distributes the k blocks into k first nodes in a distributed network storage system;

a first encoding device which constructs n-k independent blocks via linear coding employing a Maximum-Distance Separable (MDS) code from the k blocks and satisfying a property that arbitrary k of the n encoded blocks can reconstruct the file;

a second block allocation device which distributes n-k encoding blocks into n-k second storage nodes wherein, n, k are both positive integers, and satisfy n>k, and n is the number of total nodes in distributed network storage system, while k is the least number of nodes needed to reconstruct the file; and a node recovery device which determines that nodes have failed and that no more than n-k first and second nodes have failed and recovers data stored in failed first and second nodes through linear encoding via at least k intact nodes, wherein data in the failed first nodes is exactly regenerated with interference alignment and wherein data in the failed second nodes is regenerated maintaining a MDS code property.

* * * * *